United States Patent
Chou et al.

(10) Patent No.: US 11,351,648 B2
(45) Date of Patent: Jun. 7, 2022

(54) CHEMICAL MECHANICAL POLISHING APPARATUS, SLURRY, AND METHOD OF USING THE SAME

(71) Applicant: TAIWAN SEMICONDUCTOR MANUFACTURING COMPANY LTD., Hsinchu (TW)

(72) Inventors: Tung-He Chou, Hsinchu (TW); Hsun-Chung Kuang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 116 days.

(21) Appl. No.: 15/625,371

(22) Filed: Jun. 16, 2017

(65) Prior Publication Data
US 2018/0361525 A1   Dec. 20, 2018

(51) Int. Cl.
| | |
|---|---|
| B24B 1/00 | (2006.01) |
| C09G 1/02 | (2006.01) |
| H01L 21/321 | (2006.01) |
| H01L 21/66 | (2006.01) |

(52) U.S. Cl.
CPC .............. *B24B 1/005* (2013.01); *C09G 1/02* (2013.01); *H01L 21/3212* (2013.01); *H01L 22/20* (2013.01); *H01L 22/12* (2013.01)

(58) Field of Classification Search
CPC .. B24B 1/005; B24B 7/22; C09G 1/02; H01L 21/3212
USPC ...................... 451/36, 41, 288, 287
See application file for complete search history.

(56) References Cited

U.S. PATENT DOCUMENTS

| | | | |
|---|---|---|---|
| 6,059,638 A * | 5/2000 | Crevasse ................. | B24B 37/14 451/288 |
| 6,284,091 B1 * | 9/2001 | Wong ...................... | B24B 1/005 156/345.12 |
| 6,435,948 B1 * | 8/2002 | Molnar ................... | B24B 1/005 451/262 |
| 2005/0142807 A1 * | 6/2005 | Brown ................... | B24B 1/005 438/424 |

(Continued)

FOREIGN PATENT DOCUMENTS

| | | | |
|---|---|---|---|
| CN | 205237716 U | * 5/2016 | |
| EP | 1321227 A1 | * 6/2003 | ............ B24B 37/30 |

OTHER PUBLICATIONS

Boning et al., Planarization with Suspended Polyurethane Beads and a Stiff counterface: pad-in-a-bottle Experiments and Simulation, 2015 International Conference on Planarization/CMP Technology (ICPT), Chandler, AZ, 2015, pp. 1-4.

*Primary Examiner* — Katina N. Henson
(74) *Attorney, Agent, or Firm* — WPAT, P.C., Intellectual Property Attorneys; Anthony King

(57) ABSTRACT

Present disclosure provides chemical mechanical polishing (CMP) apparatus, including a counterface configured to support a semiconductor wafer at a first surface, a first electromagnet array under the first surface, a polishing head over the counterface and configured to hold the semiconductor wafer at a second surface, and a controller connects to the first electromagnet array. The first electromagnet array comprises a plurality of electromagnets, a polarity of each of the plurality of electromagnets is capable of being individually controlled by the controller. Present disclosure also provides a CMP slurry and a method for using a chemical mechanical polishing apparatus.

20 Claims, 16 Drawing Sheets

(56) References Cited

U.S. PATENT DOCUMENTS

2006/0189256 A1* 8/2006 Donis .................. B24B 1/005
451/5
2011/0312182 A1* 12/2011 Borucki .............. B24B 37/042
438/693

* cited by examiner

CHEMICAL MECHANICAL POLISHING APPARATUS, SLURRY, AND METHOD OF USING THE SAME

BACKGROUND

A semiconductor wafer typically includes a substrate, such as such as a silicon or gallium arsenide wafer, on which a plurality of integrated circuits have been formed. Integrated circuits are chemically and physically integrated into a substrate by patterning regions in the substrate and layers on the substrate. The layers are generally formed of various materials having either a conductive, insulating or semiconducting nature. In order for a device to have high yields, it is crucial to start with a flat semiconductor wafer and, as a result, it is often necessary to polish a side or part of a semiconductor wafer. If the process steps of device fabrication are performed on a wafer surface that is not uniform, various problems can occur which may results in a large number of inoperable devices. For example, in fabricating modern semiconductor integrated circuits, it is necessary to form conductive lines or similar structures above a previously formed structure. However, prior surface formation often leaves the top surface topography of a wafer highly irregular, with bumps, areas of unequal elevation, troughs, trenches and other similar types of surface irregularities. As a result, global planarization of such surfaces is necessary to ensure adequate focus depth during photolithography, as well as removing any irregularities and surface imperfections during the various stages of the fabrication process. Although several polishing techniques exist to ensure wafer surface planarity, processes employing chemical mechanical planarization or polishing techniques have achieved widespread usage to planarize the surface of wafers during the various stages of device fabrication in order to improve yield, performance and reliability. In general, chemical mechanical polishing ("CMP") involves the circular motion of a wafer under a controlled downward pressure with a polishing pad saturated with a conventional polishing slurry.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

Like reference symbols in the various drawings indicate like elements.

DETAILED DESCRIPTION OF THE DISCLOSURE

Figure 1:
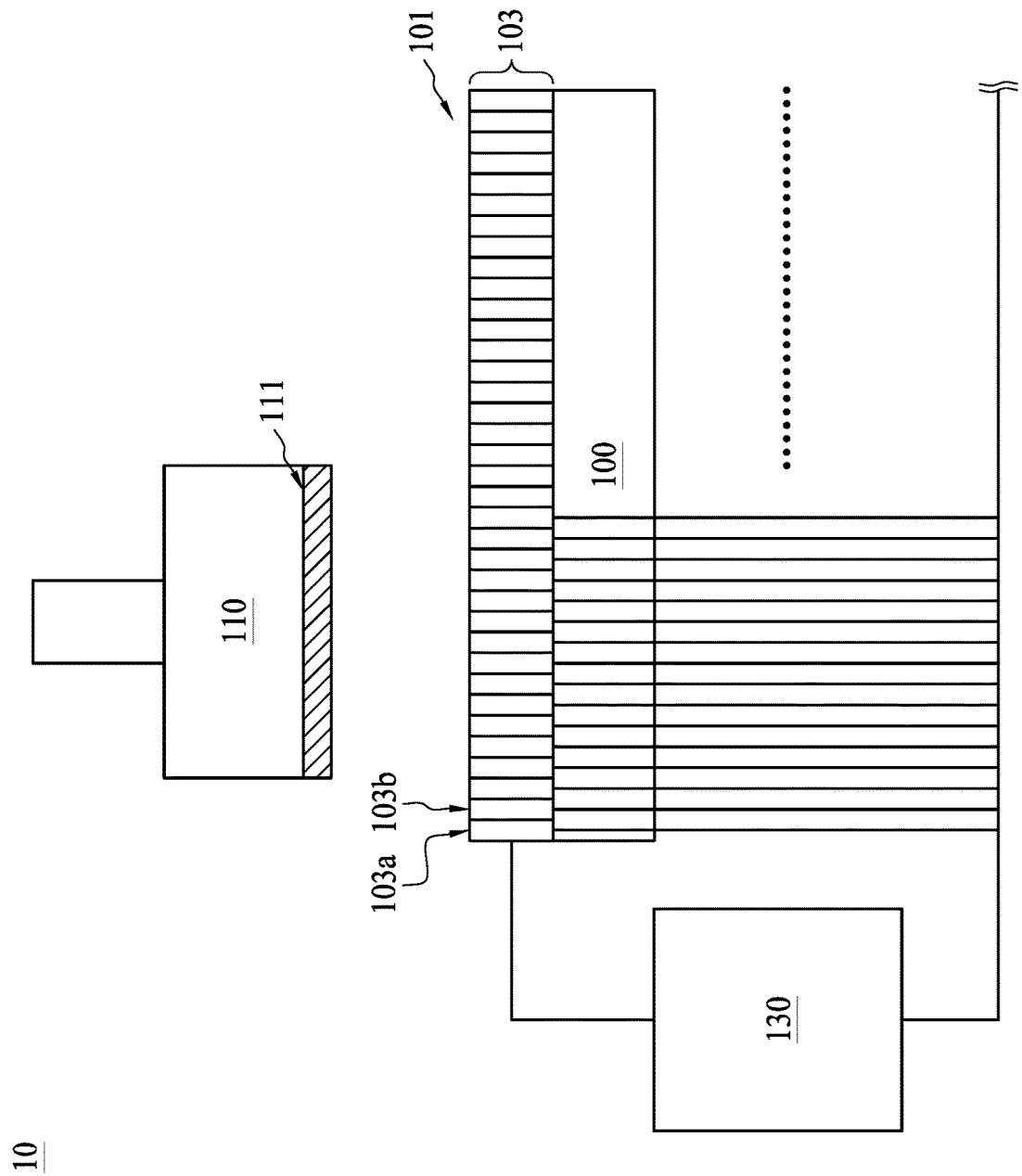
FIG. 1 is a cross sectional view showing a chemical mechanical polishing (CMP) apparatus, in accordance with some embodiments of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It is to be understood that elements not specifically shown or described may take various forms. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

In a typical chemical mechanical polishing process, the substrate is placed in direct contact with a rotating polishing pad. A polishing head applies pressure against the backside of the substrate. During the polishing process, the pad and a counterface are rotated while a downward force is maintained against the substrate back. The substrate and the polishing pad can be rotated in the same direction or in opposite directions, whichever is desirable for the particular polishing process being carried out. The polishing head also can oscillate across the polishing pad on the counterface. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride and the like.

Polishing pads made of harder materials exhibit high removal rates and have long useful pad life, but tend to produce numerous scratches on substrates being polished. Polishing pads made of softer materials may exhibit less scratching of substrates than polishing pads made of harder materials, but tend to exhibit lower removal rates and have shorter useful pad life. Apart from the materials of the polishing pad, asperities on the polishing pad are randomly distributed and thus the locations of the asperities cannot be controlled according to a topography of substrate or wafer to be polished. Completely random asperities on the polishing pad approach a uniform removing net effect because a same amount of removing events occurs in every location of the substrate to be polished. However, inherent defects in substrate profile, for example, wafer dishing, can be exacerbated by such uniform removing net effect. To planarize a dishing wafer, more removing events is required at an edge of the wafer where the surface feature of the wafer is comparatively protruded than at a center of the wafer where the surface feature of the wafer is dished.

Similarly, within an enclosed region of a die pattern on a wafer, unifrom removing net effect may not be always desired. If a first location in the die pattern requires more removing events while a second location in the die pattern requires less removing events, conventional uniform removing net effect cannot satisfy such needs.

Present disclosure provides a CMP apparatus and CMP slurry together achieving controllable asperities corresponding to specific wafer or die profile.

Referring to FIG. 1, FIG. 1 is a cross sectional view showing a chemical mechanical polishing (CMP) apparatus 10, in accordance with some embodiments of the present disclosure. A substrate carrier or polishing head 110 is mounted on a carrier assembly (not shown) and positioned in contact with a counterface 100 in a CMP apparatus 10. A first surface 101 of the counterface 100 is facing a second surface 111 of the polishing head 110. The carrier assembly provides a controllable pressure to the substrate to be polished 102, urging the substrate 102 against the first surface 101. In some embodiments, no conventional polishing pad is placed over the first surface 101. Apart from the substrate 102, medium between the first surface 101 and the second surface 111 can only be a the CMP slurry discussed herein. As a result, the first surface 101 is a surface rough enough to prevent rotational movement of magnetic polymer beads in the CMP slurry. In some embodiments, the first surface 101 is made of polycarbonate materials.

A first electromagnet array 103 is disposed underneath the first surface 101 by a predetermined distance. In some embodiments, the predetermined distance could be negligible. As shown in FIG. 1, the first electromagnet array 103 is composed of a plurality of electromagnets 103a, 103b, . . . etc., adjacently lining with each other. In some embodiments, the polarity of the electromagnets are controlled by a controller 130 connected thereto. The connection between the controller 130 and each of the plurality of the electromagnets, for example, electromagnet 103a and electromagnet 103b, is arranged in a way that the polarity of the electromagnet 103a can be independent from the polarity of the electromagnet 103b.

Figure 2:
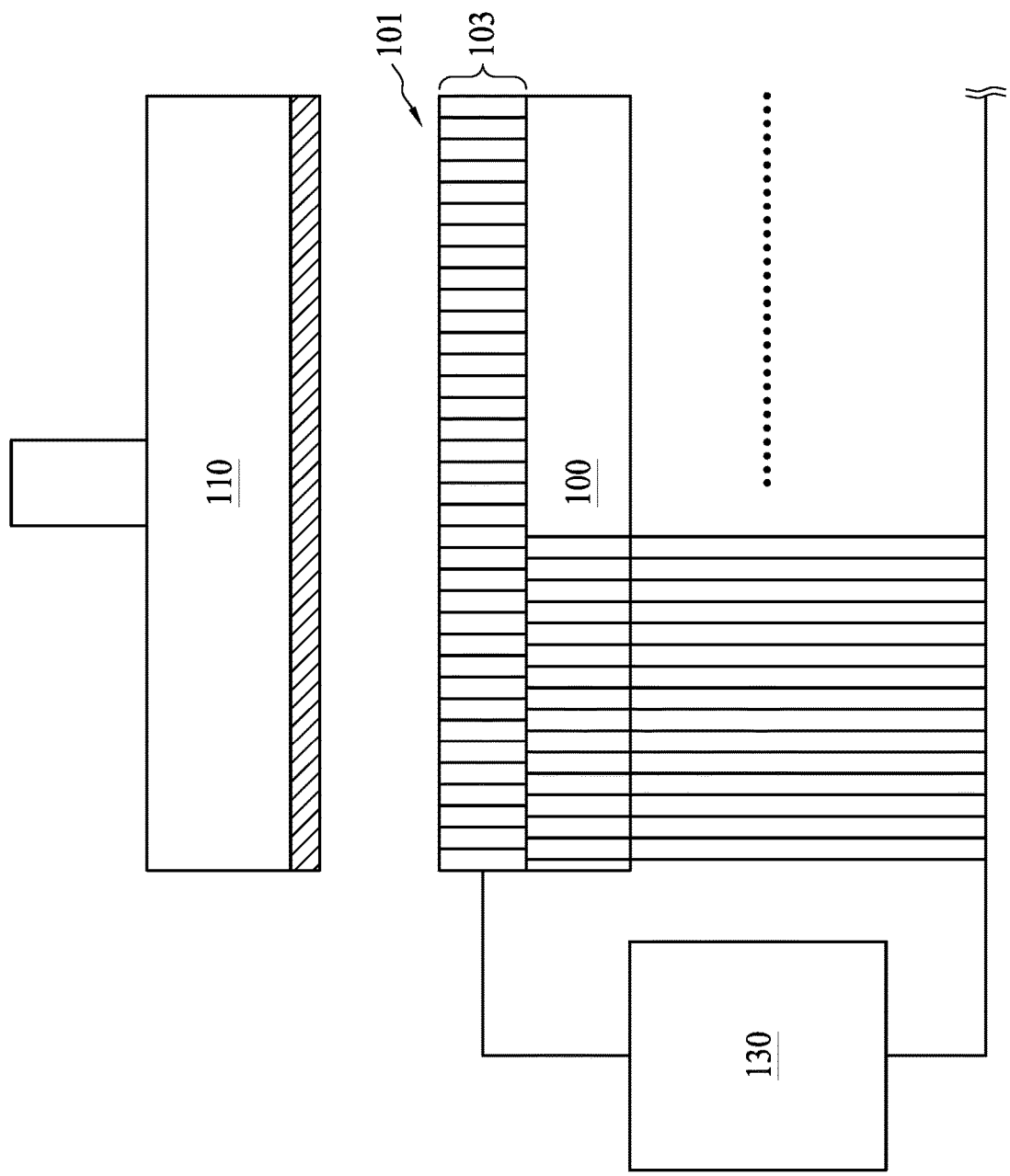
FIG. 2 is a cross sectional view showing a chemical mechanical polishing (CMP) apparatus, in accordance with some embodiments of the present disclosure.
Figure 3:
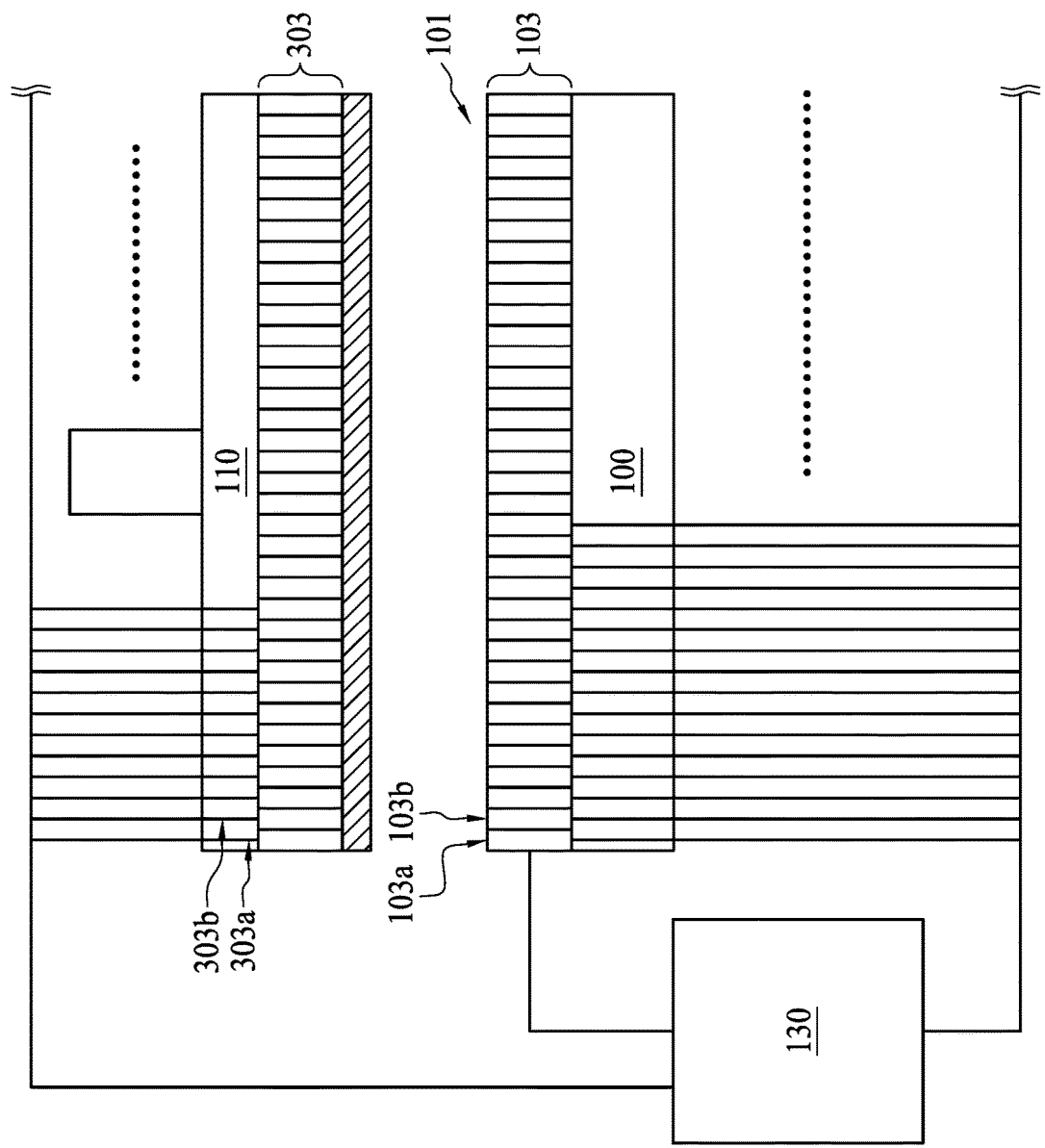
FIG. 3 is a cross sectional view showing a chemical mechanical polishing (CMP) apparatus, in accordance with some embodiments of the present disclosure.

As shown in FIG. 1, an area of the counterface 100 is greater than an area of the substrate 102 and that of the polishing head 110. In this embodiment, the first surface 101 is moved relative to the substrate 102 by an external driving force. The relative movement of the first surface 101 and substrate 102 serves to abrade the surface of the substrate to remove a portion of the material from the substrate surface, thereby polishing the substrate 102. The polishing of the substrate by the relative movement of the first surface 101 and the substrate typically is further aided by the chemical activity of the polishing composition and/or the mechanical activity of an abrasive suspended in the polishing composition. Of course, in other embodiments, when an area of the counterface 100 is substantially similar to an area of the substrate 102 and that of the polishing head 110, as shown in FIG. 2 and FIG. 3, no relative movement of the first surface 101 and substrate 102 is required. In some embodiments, the substrate 102 rotates around a center point of the polishing head 110

Referring to FIG. 3, FIG. 3 is a cross sectional view showing a chemical mechanical polishing (CMP) apparatus 30, in accordance with some embodiments of the present disclosure. A second electromagnet array 303 is disposed over the second surface 111 by a predetermined distance. In some embodiments, the predetermined distance is negligible. As shown in FIG. 3, the second electromagnet array 303 is composed of a plurality of electromagnets 303a, 303b, . . . etc., adjacently lining with each other. In some embodiments, the polarity of the electromagnets are controlled by a controller 130 connected thereto. The connection between the controller 130 and each of the plurality of the electromagnets, for example, electromagnet 303a and electromagnet 303b, is arranged in a way that the polarity of the electromagnet 303a can be independent from the polarity of the electromagnet 303b.

As shown in FIG. 3, in some embodiments, the electromagnet 303a of the second electromagnet array 303 is projectively corresponding to the electromagnet 103a of the first electromagnet array 103. Similarly, the electromagnet 303b of the second electromagnet array 303 is projectively corresponding to the electromagnet 103b of the first electromagnet array 103. Without considering polarity of each electromagnet of the first electromagnet array 103 and the second electromagnet array 303, the electromagnet 303a is winded to be positioned projectively above or aligning with the electromagnet 103a. The projectively correspondence between the electromagnet 303a and electromagnet 103a could further enhance the magnetic force intended to be exerted over a specified portion of the magnetic polymer beads in the slurry discussed herein.

On the other hand, the first electromagnet array 103 in FIG. 3 is also projectively corresponding to the second electromagnet array 303. For example, the first electromagnet array 103 is under an area projection of the second electromagnet array 303. In some embodiments, an area of the first electromagnet array 103 and an area of the second electromagnet array 303 is substantially identical. As previously shown in FIG. 1, if a second electromagnet array 303 is disposed above the second surface 111 of the polishing head 110, the second electromagnet array 303 is not projectively corresponding to the first electromagnet array 103 since an area of the polishing head 110 is smaller than that of the counterface 100.

In FIG. 3, the controller 130 is connected to the first electromagnet array 103 and the second electromagnet array 303 in order to control the polarity of each of the electromagnets therein. However, in some embodiments, only one of the first electromagnet array 103 and the second electromagnet array 303 is activated. For example, prior to the substrate 102 being disposed over the counterface 100, the second electromagnet array 303 in the polishing head 110 is shut off. For another example, after the substrate 102 being disposed over the counterface 100 and under the polishing head 110, the first electromagnet array 103 is shut off. People having ordinary skill in the art would appreciate that the control of the first electromagnet array 103 and the second electromagnet array 303 are programmable and is determined according to the magnetic force required to manipulate the vertical location of the magnetic polymer beads once the topography information of the substrate 102 is inputted to the controller 120.

Figure 4:
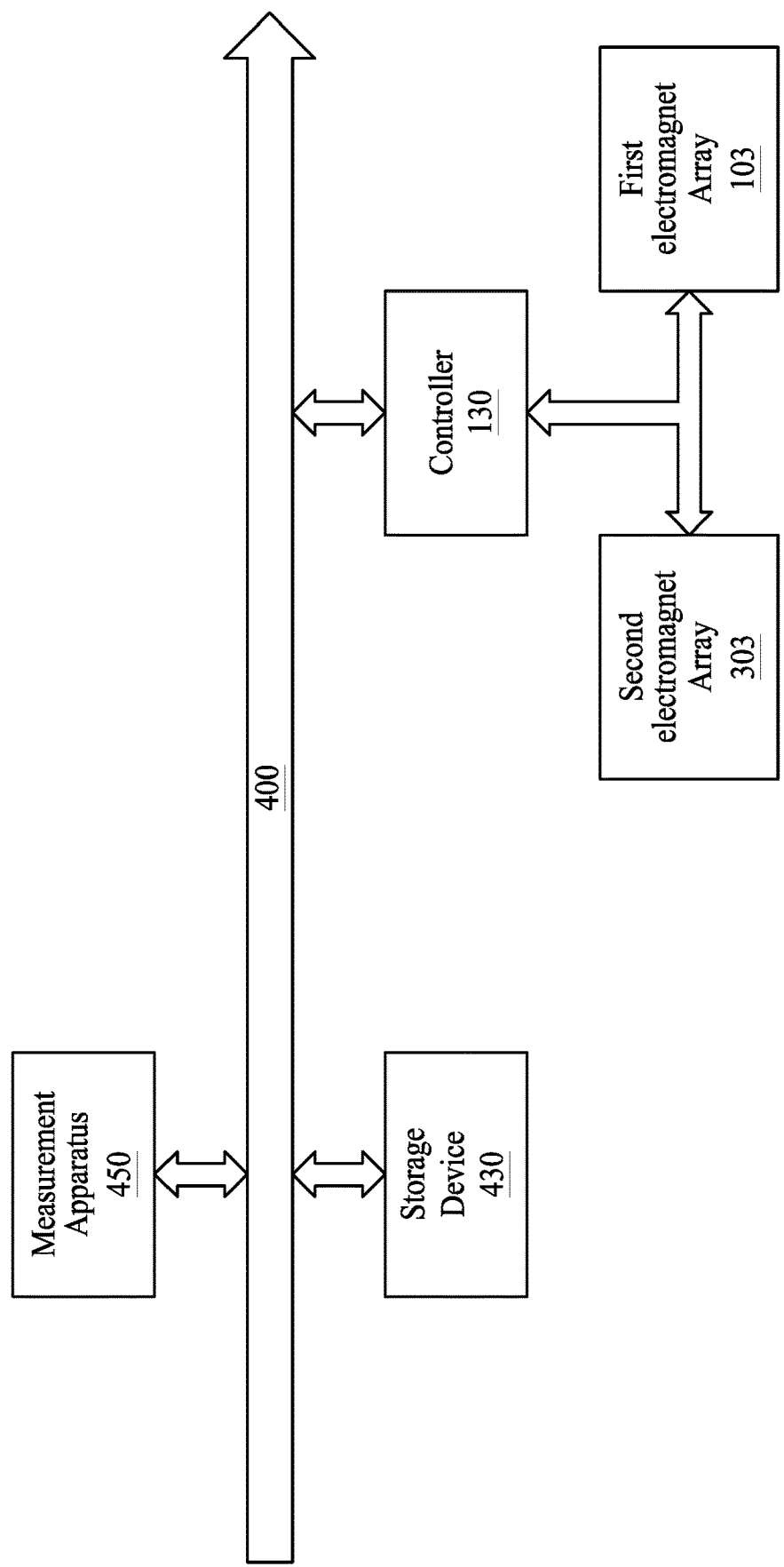
FIG. 4 is a block diagram showing a controlling system of a CMP apparatus, in accordance with some embodiments of the present disclosure.

Referring to FIG. 4, FIG. 4 is a block diagram showing a controlling system 40 of a CMP apparatus, in accordance with some embodiments of the present disclosure. The measurement apparatus 450, a storage device 430, and the controller 130 are communicating to each other through a bus 400. In some embodiments, when a substrate 102 is to be placed over the CMP apparatus for planarization, surface topography of the substrate 102 is measured at the measurement apparatus 450. In some embodiments, the measurement apparatus 450 can be independent from the CMP apparatus or the controlling system 40 and the topography information is transferred through other storage means. The measurement apparatus 450 includes microscope, laser, interferometer, electron beam inspection, and the like. The topography information then being stored into the storage device 430, indicating a first region of a substrate 120 or a die on the substrate 120 requiring more removing events and a second region of the same requiring less removing events. The classification could be more sophisticated such more than two regions can be identified according to different precision needs.

After receiving the topography information from the storage device 430 through bus 400, the controller 130 outputting instruction to the first electromagnet array 103 and/or the second electromagnet array 303. Detailed instruction from the controller is later discussed when addressing FIG. 9 to FIG. 12.

Figure 5:
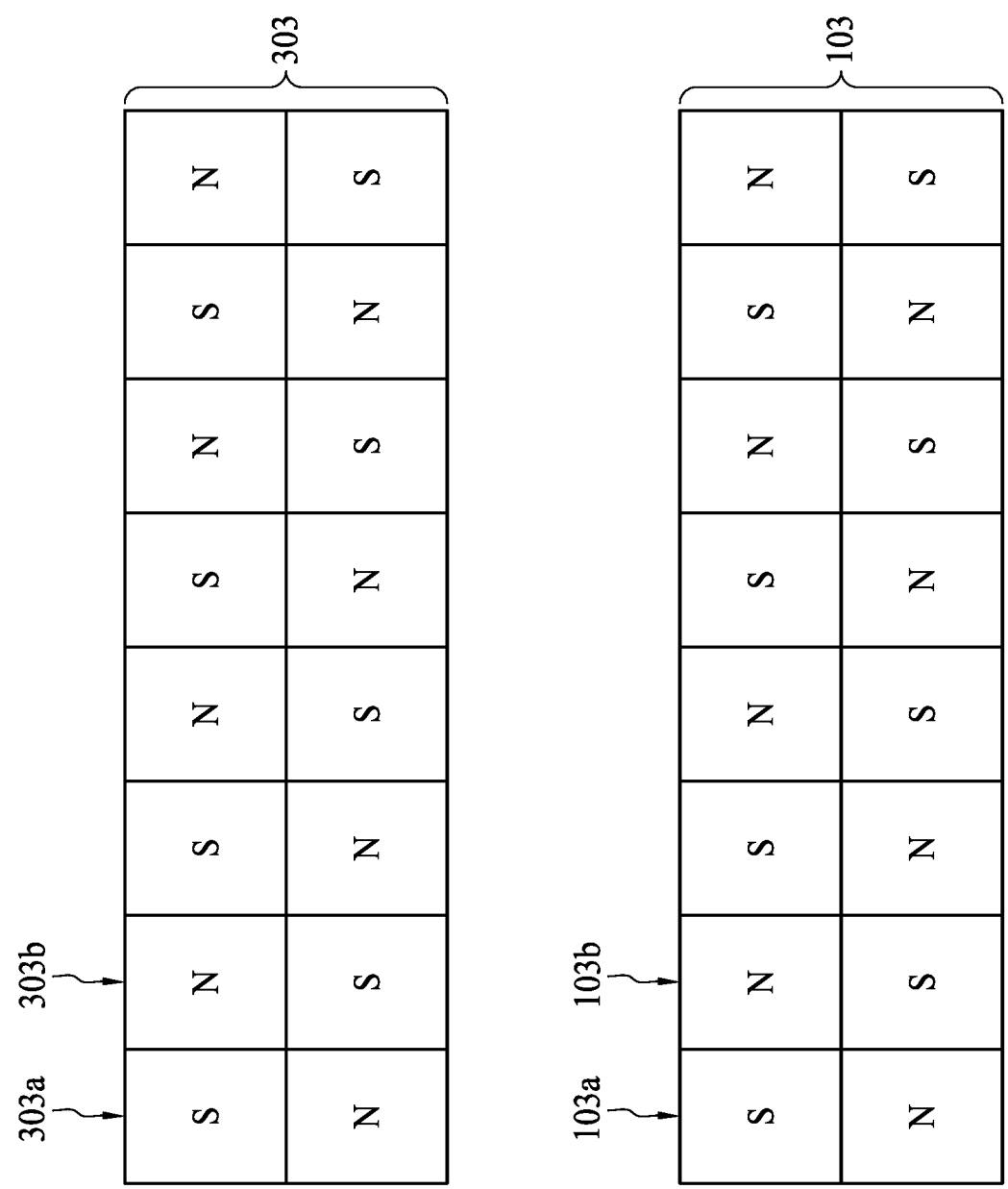
FIG. 5 is an illustration showing magnetic polarities of an electromagnet array at a polishing head and at a counterface, in accordance with some embodiments of the present disclosure

Referring to FIG. 5, FIG. 5 is an illustration showing magnetic polarities of an electromagnet array at a polishing head and at a counterface, in accordance with some embodiments of the present disclosure. In some embodiments as discussed FIG. 3, each of the magnets in the first electromagnet array 103 is positioned projectively corresponding to each of the magnets in the second electromagnet array 303. Moreover, in some embodiments where both the first electromagnet array 103 and the second electromagnet array 303 are activated, the polarity of the each of the magnets of the first electromagnet array 103 can be controlled identical to the polarity of the corresponding magnets of the second electromagnet array 303. For example, magnet 103a possesses a polarity pointing upward (i.e., from N pole to S pole), correspondingly, magnet 303a possesses a same polarity pointing upward. Similarly, magnet 103b possesses a polarity pointing downward (i.e., from N pole to S pole), correspondingly, magnet 303b possesses a same polarity pointing downward. The winding design of the electromagnet to achieve such polarities is common knowledge in the field of art.

Figure 6:
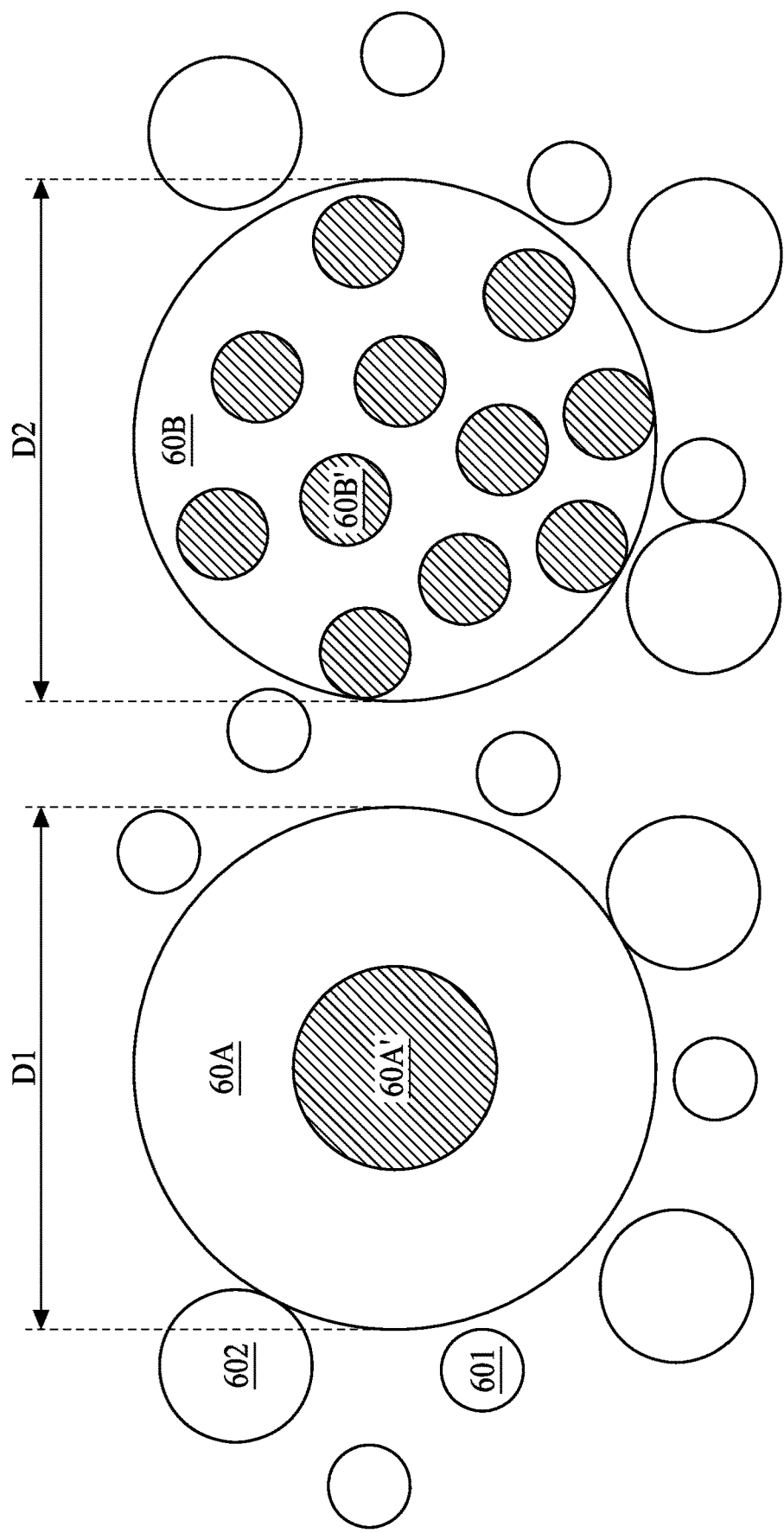
FIG. 6 is an illustration showing cross sections of magnetic polymer beads in a slurry, in accordance with some embodiments of the present disclosure.

Referring to FIG. 6, FIG. 6 is an illustration showing cross sections of magnetic polymer beads 60A, 60B in a CMP slurry, in accordance with some embodiments of the present disclosure. The slurry provided in the present disclosure include magnetic polymer beads 60A and/or 60B, an abrasive material 601, and an oxidizing agent 602. Magnetic material 60A' and 60B' is enclosed in the magnetic polymer beads in different forms. For bead 60A, magnetic material 60A' is enclosed by polymeric materials in a core position, such as a core-and-shell bead with a magnetic core and a hard shell coating of polymerized monomer or a silanizing agent, polyglutaraldehyde shell around ferrofluid core particles, suspension or emulsion polymerized coating around submicron magnetic particles, or ferrofluid particles in polystyrene latex particles. For bead 60B, magnetic material 60B' is dispersed in the polymeric materials such as silanized magnetic oxide particles of polydisperse size and shape, porous polymer particles filled with magnetic materials such as polymer-ferrite or polymer maghemite composite systems. However, the surface of the magnetic polymer bead 60A or 60B is composed of polymeric materials in order to maintain the polishing capability to semiconductor substrates.

In some embodiments, a diameter D1 for bead 60A and a diameter D2 for bead 60B are under 100 micrometer, for example, 10-50 micrometer. Preparation of the beads 60A and 60B can be, but not limited to, the following. Cobalt and nickel ferrite particles of about 0.1 and 0.2 μm in diameter and of spherical shape were formed in large, loosely-held brown aggregates. Zinc gave low yields of light brown magnetic material of less than 0.2 μm diameter even after 72 hours of heat treatment. Dark brown manganese ferrite particles of uniform, spherical shape and 0.3 μm diameter were obtained as single particles in 83-88% yields. Similar light brown manganese-zinc ferrite particles were produced in 49-55% yield after 72 hours of heat treatment at 90° C. For barium, the procedure was modified since BaSO4 is insoluble in water. (Except for the case where barium is present, the divalent metals may be used as their chlorides or sulfates as well as their nitrates). Thus 6.25 mmol (6.25 ml) of 1M FeCl2 solution, 0.5 mmol (5.0 ml) of 0.1 Ba(NO3)2 solution and 25 ml of 2% gelatin were mixed and purged with N2 gas for 10 minutes (Solution D). Solution C and the remainder of the ferrite preparation procedure was unchanged except 10 mmol KOH solution (2 ml) was used and the heat treatment was continued for 20 hours. Black barium ferrite particles of uniform non-spherical shape with a 0.2 μm diameter were produced In some embodiments, oxidizing agent 602 is added in the CMP slurry. The oxidizing agents useful in the chemical mechanical polishing slurry are incorporated into a CMP slurry to aid in oxidizing the multiple metal layers to their corresponding oxide, hydroxide, or ions. For example, the oxidizing agents may be used to oxidize a metal layer to its corresponding oxide or hydroxide, e.g., titanium to titanium oxide, tungsten to tungsten oxide, copper to copper oxide, and aluminum to aluminum oxide. The oxidizing agents are useful when incorporated into a polishing slurry to polish metals and metal based components including titanium, titanium nitride, tantalum, copper, tungsten, aluminum, and aluminum alloys such as aluminum/copper alloys, and various mixtures and combinations thereof by mechanically polishing the metals to remove the respective oxide layer.

In some embodiments, abrasive materials 601 are added in the CMP slurry. The abrasive material is typically a metal oxide abrasive. The metal oxide abrasive may be selected from the group including alumina, titania, zirconia, germania, silica, ceria and mixtures thereof. The CMP slurry preferably includes from about 1.0 to about 9.0 weight percent or more of an abrasive. However, that the CMP slurry includes from about 3.0 to about 6.0 weight percent abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

Figure 7:
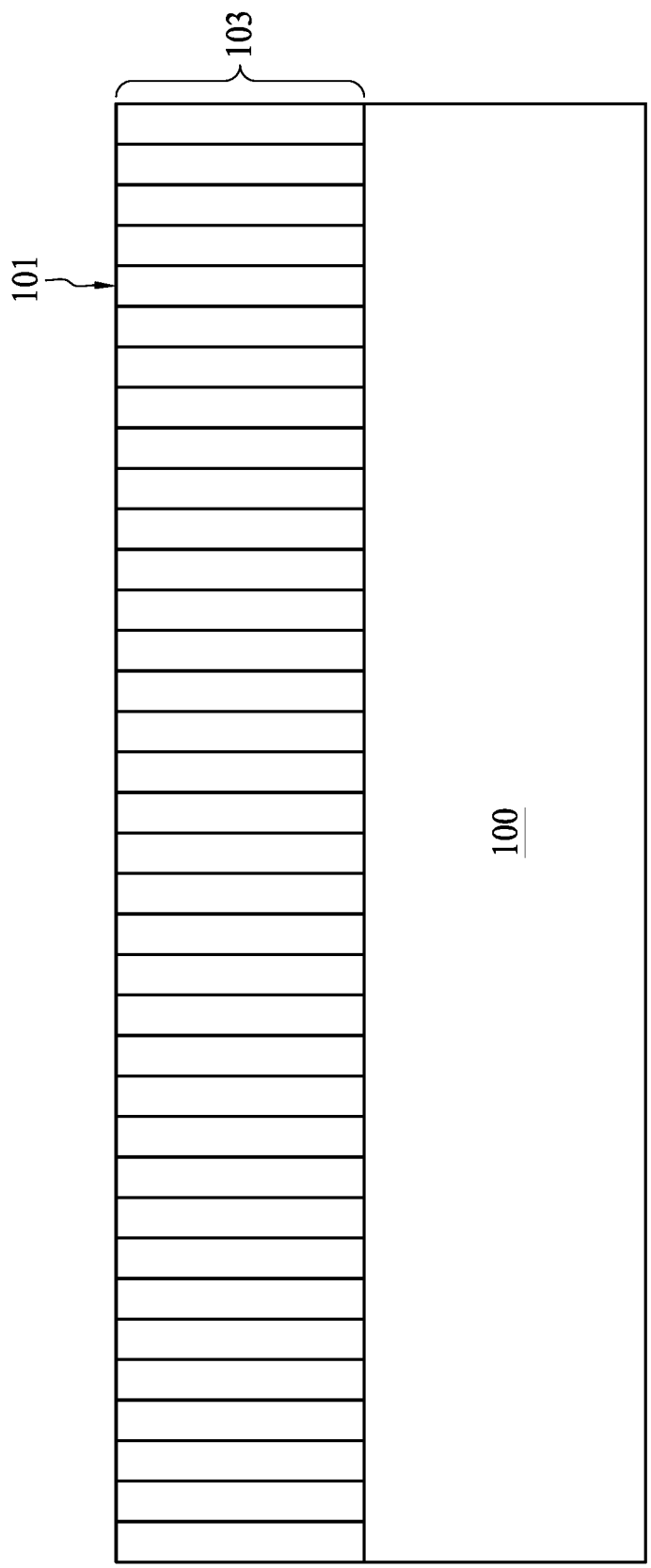
FIG. 7 to FIG. 11 are cross sectional views showing a method for using a CMP apparatus with the slurry described herein, in accordance with some embodiments of the present disclosure.
Figure 8:
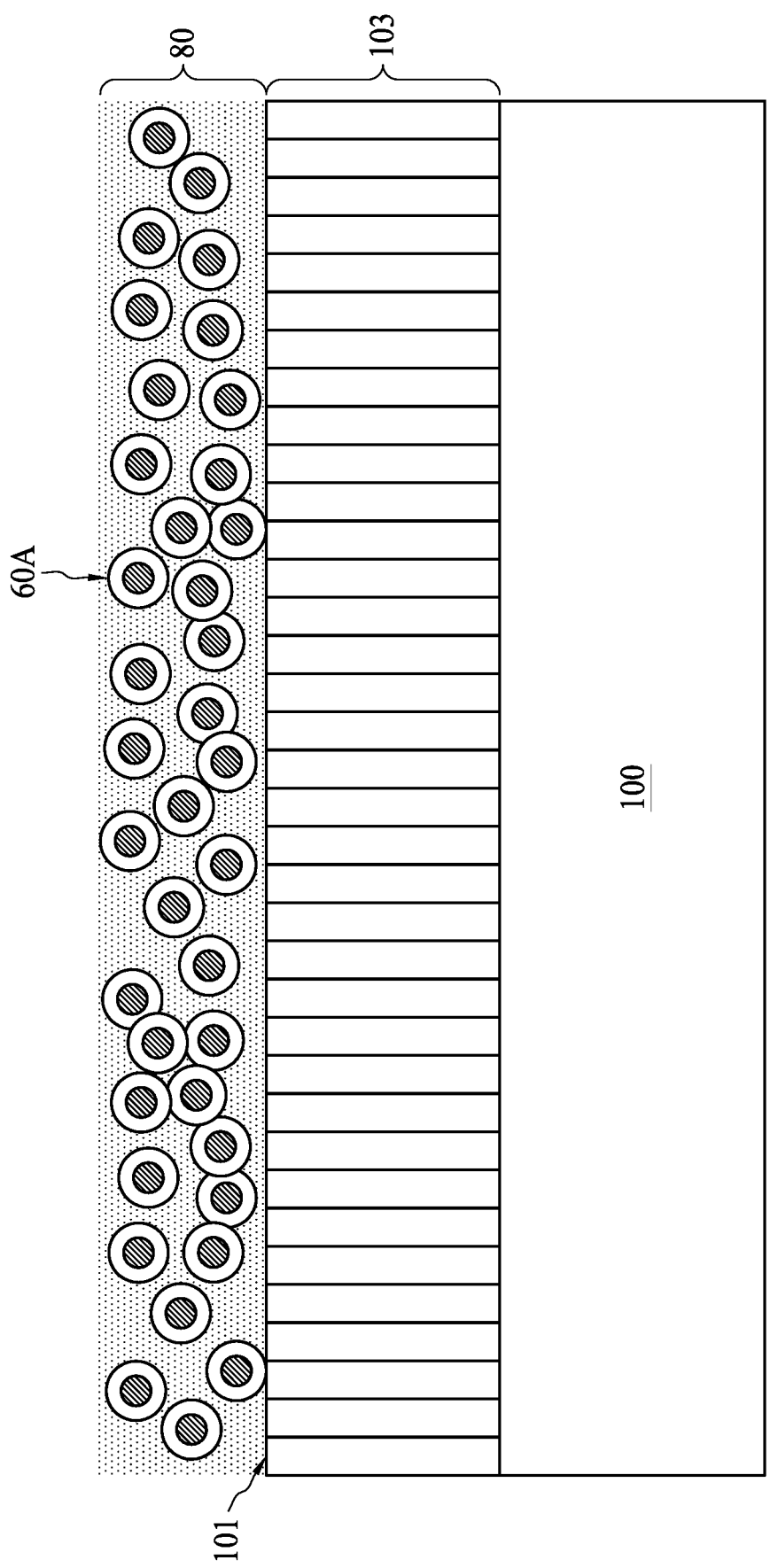

FIG. 7 to FIG. 11 are cross sectional views showing a method for using a CMP apparatus with the slurry described herein, in accordance with some embodiments of the present disclosure. In FIG. 7, a counterface 100 is provided with a first surface 101 undergoing a roughening operation so as to prevent the rotation of the magnetic polymer beads subsequently to be applied. A first electromagnet array 103 is positioned under the first surface 101. In FIG. 8, the CMP slurry 80 described herein is applied onto the first surface 101. The first electromagnet array 103 under the first surface 101 can be shut down or activated while applying the CMP slurry 80. FIG. 8 shows the condition of keeping the first electromagnet array 103 shut down during the application of the CMP slurry 80. At the moment of application, the magnetic polymer beads 60A are dispersed in the solution where no preference of contacting or away from the first surface 101 is observed.

Figure 9:
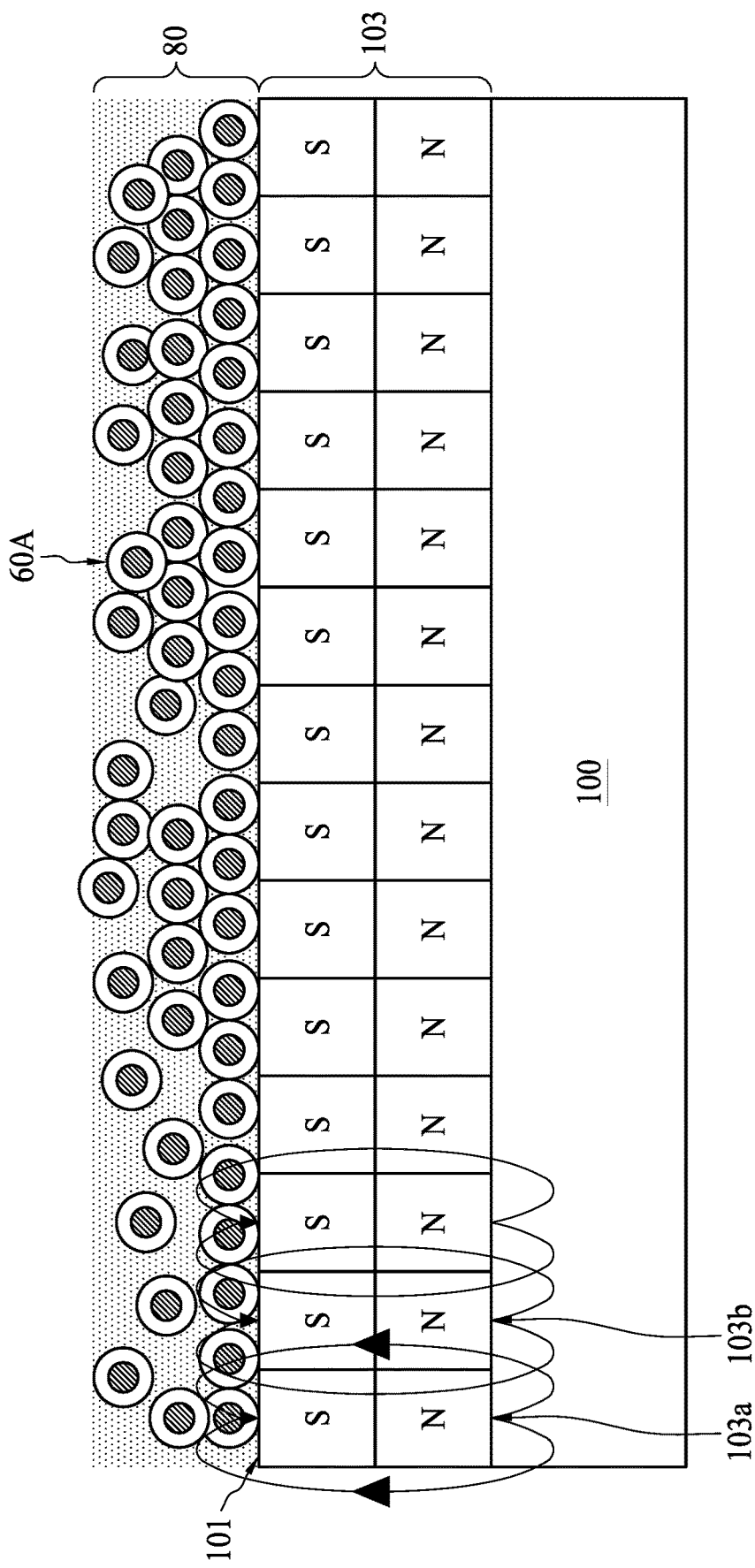

In FIG. 9, the first electromagnet array 103 is activated to show a first polarity pattern, that is, an N pole under an S pole. In this embodiment, a polarity pointing upward (from N pole to S pole) is demonstrated. The magnetic line exerts a magnetic force on the magnetic polymer particle in the CMP slurry. Because the magnetic line is pointing outward from the N pole and inward to the S pole, the magnetic force exerted on the magnetic polymer beads 60A is pulling down the beads 60A toward the first surface 101. Since the polarity of each of the electromagnets in the first electromagnet array 103 is identical, a uniform pulling force attracts the magnetic polymer beads 60A toward the first surface 101, thereby evenly spreading the magnetic polymer beads 60A on the first surface 101 can be reasonably expected. The magnitude of the magnetic force to be exerted on the beads can be altered by the electromagnet winding or the electrical current passing through the winding.

Figure 10:
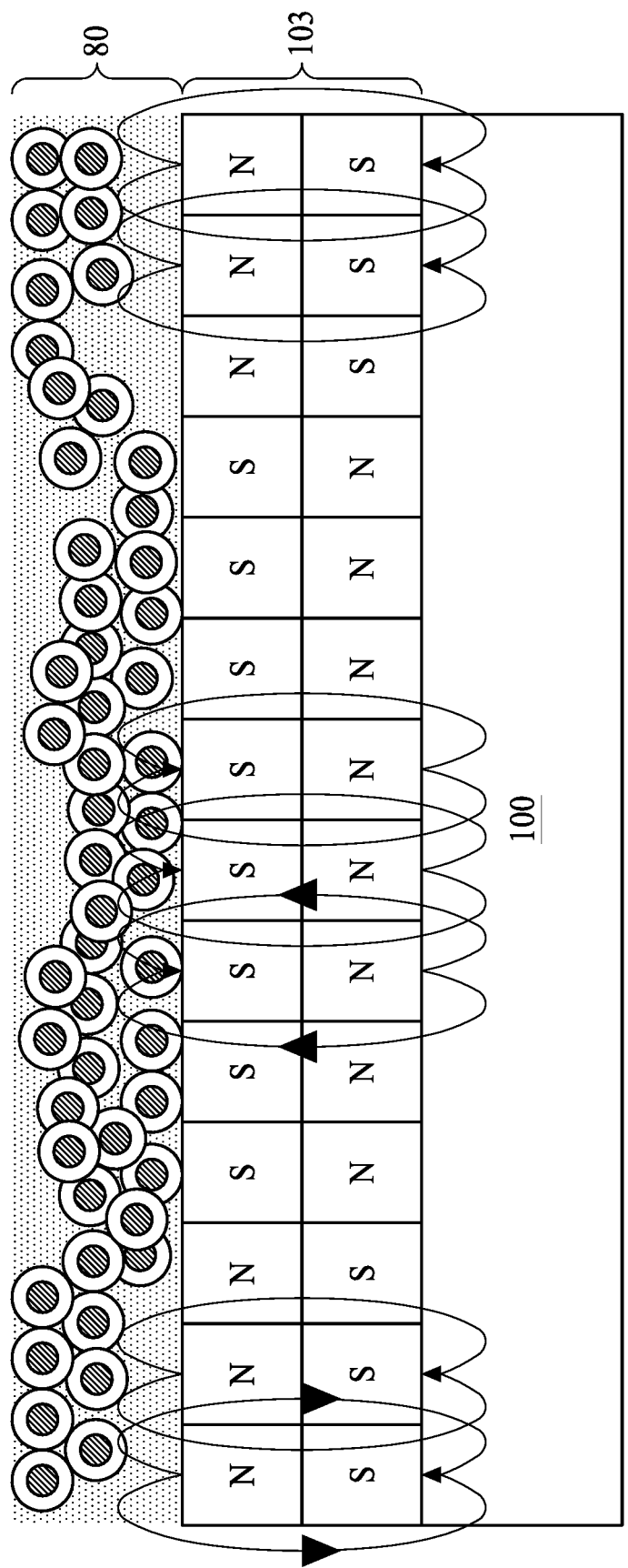
Figure 11:
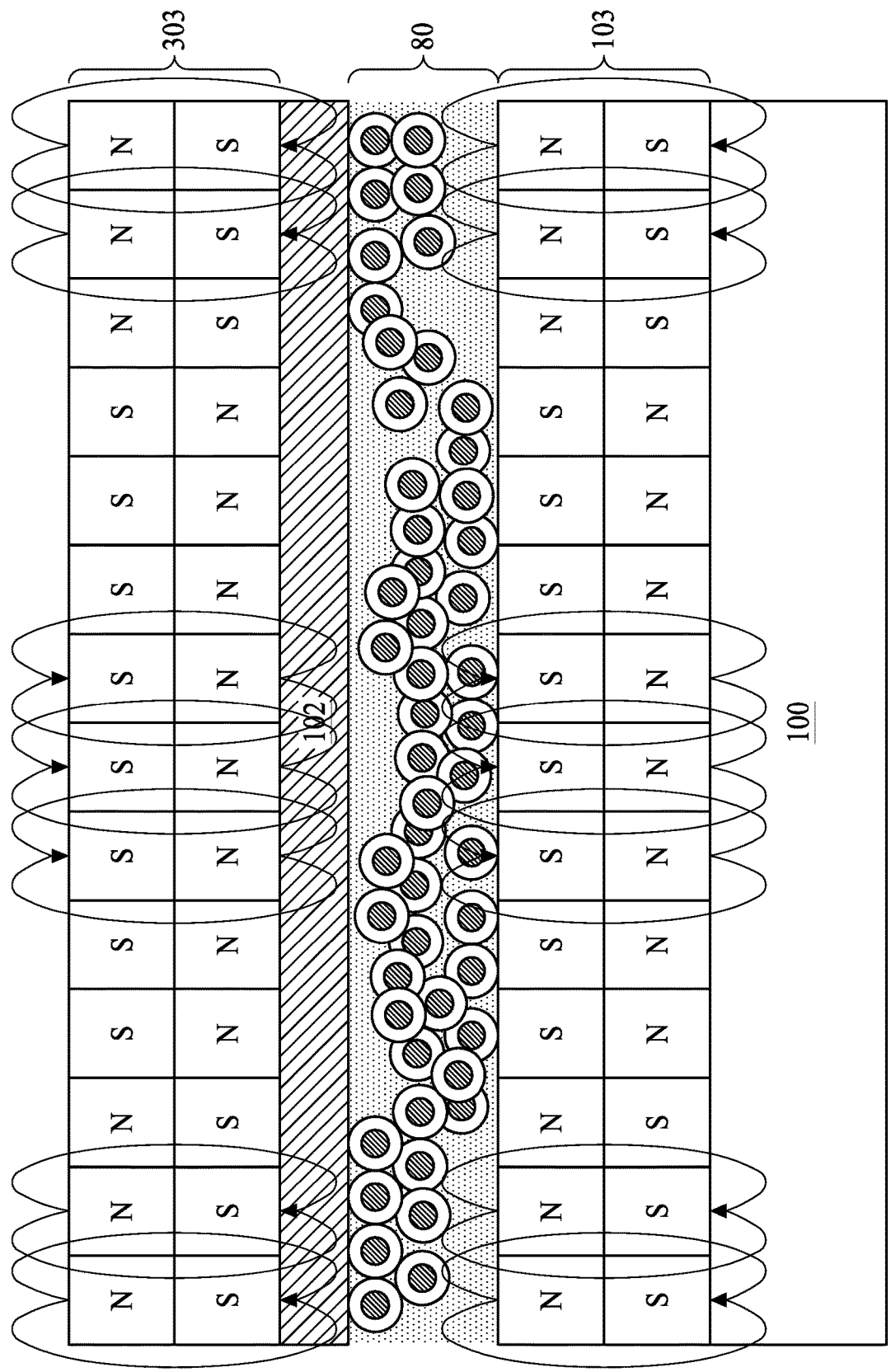

In FIG. 10 and FIG. 11, the polarity of the first electromagnet array 103 is altered according to a topography information of the semiconductor substrate to be processed (not shown in FIG. 10). As shown in FIG. 10, the polarity of the electromagnets in proximity to a peripheral of the counterface 100 is changed to a second polarity pattern, that is, an N pole over an S pole. When the topography information of the substrate shows a dishing profile, i.e., a center of the substrate facing the CMP slurry is lower than a peripheral of the substrate, the controller 130 alters the polarities of the electromagnets at the peripheral of the substrate from the first polarity pattern to the second polarity pattern. As shown in FIG. 10, the beads 60A situated over the peripheral of the counterface 100 are receiving repulsive magnetic force from the second polarity pattern and moves in a substantially vertical fashion away from the first surface 101. On the other hand, the beads 60A situated over the center of the counterface 100 remain close to the counterface 100 due to the attraction magnetic force of the electromagnet having the first polarity pattern.

The coexistence of the first polarity pattern and the second polarity pattern raise the number of the removing events at the peripheral of the substrate and lower the number of the removing events at the center of the substrate. As shown in FIG. 11, when the second electromagnet array 303 having the same polarity pattern as the first electromagnet array 103 and holding the substrate 102 approaches the CMP slurry 80, the attraction force and repulsive force is enhanced compared to the setting illustrated in FIG. 10. The peripheral of the substrate 102 is in contact with more magnetic polymer beads 60A than the center of the substrate 102, and hence peripheral of the substrate 102 is experiencing more removing events than the center of the substrate 102.

It should be understood by people having ordinary skill in the art that the polarity pattern could be more complicated than the embodiments disclosed above, however, the attraction and repulsive force exertion on predetermined region according to the topography information of the substrate to be polished shall be encompassed by the scope of the present disclosure.

Figure 12:
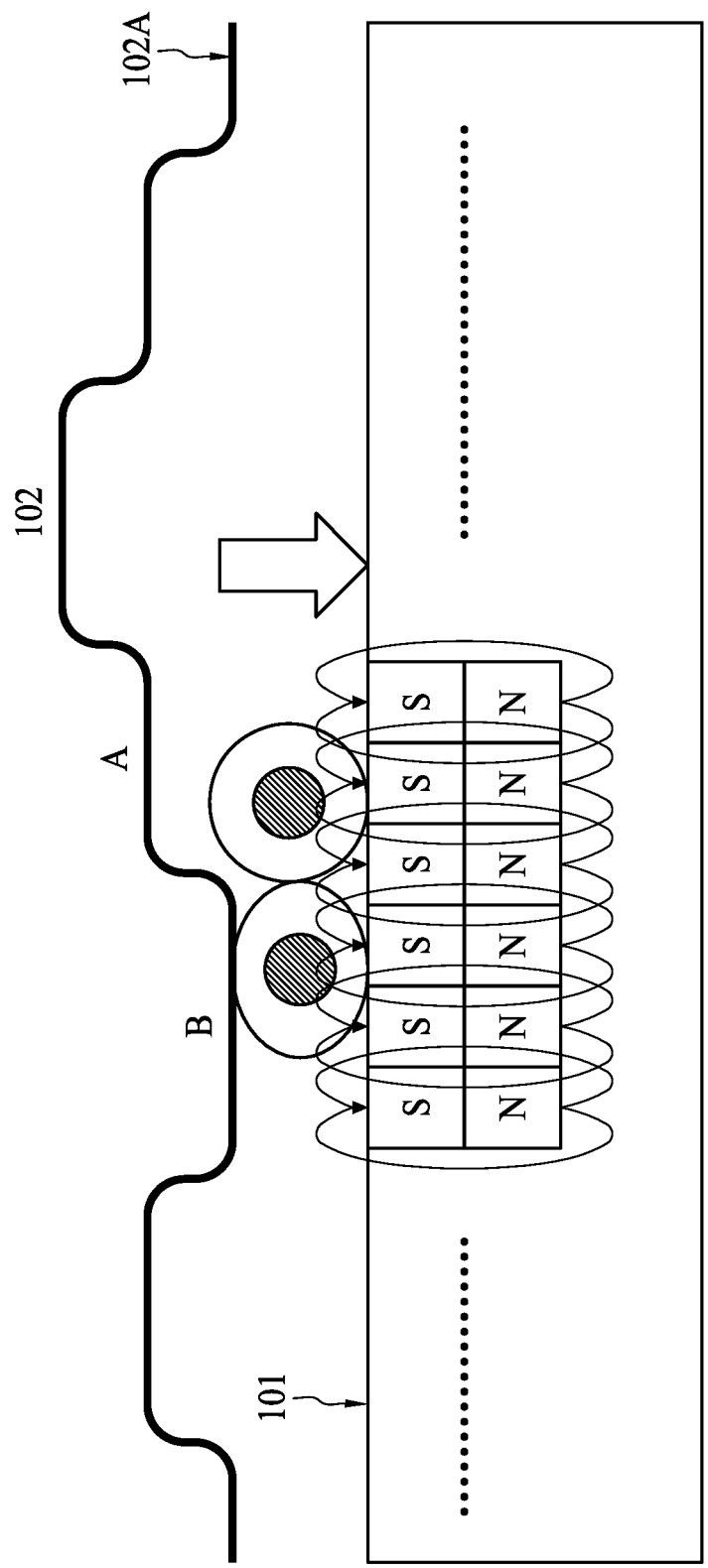
FIG. 12 is a cross section illustrating magnetic force exerting on magnetic polymer beads, in accordance with some embodiments of the present disclosure.

Referring to FIG. 12, FIG. 12 is a cross section illustrating magnetic force exerting on magnetic polymer beads 60A, in accordance with some embodiments of the present disclosure. FIG. 12 shows a close-up look at the surface of the substrate 102 to be polished. The surface 102A shows an uneven surface topography having an A recess and a B protrusion. When the electromagnets in the first electromagnet array 103 is in the first polarity, that is, an attraction force is exerted on the magnetic polymer beads 60A, the beads situated close to the first surface 101, that is, away from the surface 102A of the substrate 102. In this connection, the number of removing event at the B protrusion remains as the same as if no magnetic force is applied because the distance between the B protrusion and the first surface 101 is smaller than the diameter of the bead 60A. However, the number of the removing event at the A recess is reduced because the distance between the A recess and the first surface 101 is greater than the diameter of the bead 60A, and hence the bead 60A is possible to being away from surface 102A of the substrate by responding to the attractive force of the electromagnets.

Figure 13:
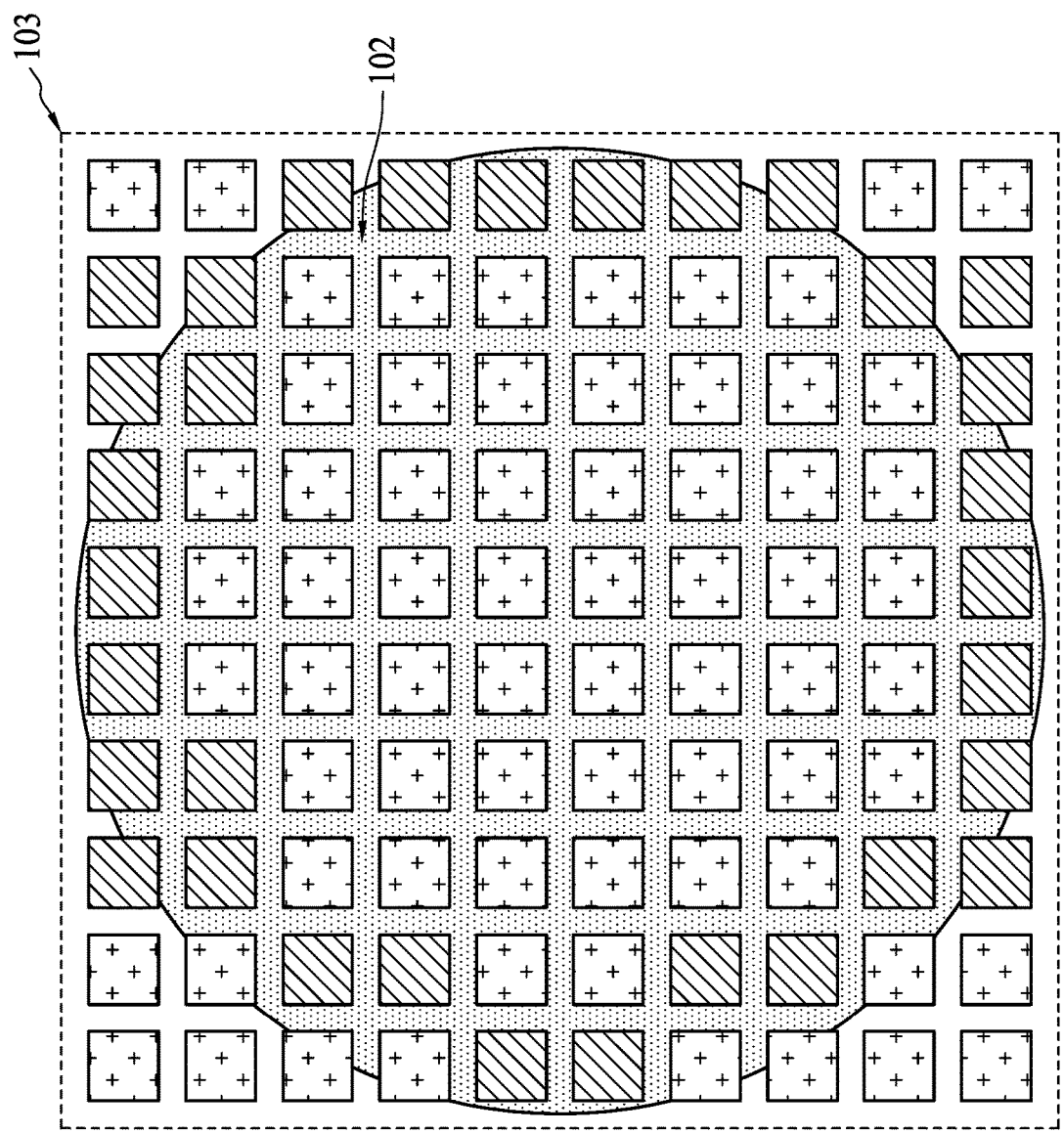
FIG. 13 is a top view showing a mix of a first and a second polarity patterns across a wafer, in accordance with some embodiments of the present disclosure.
Figure 14:
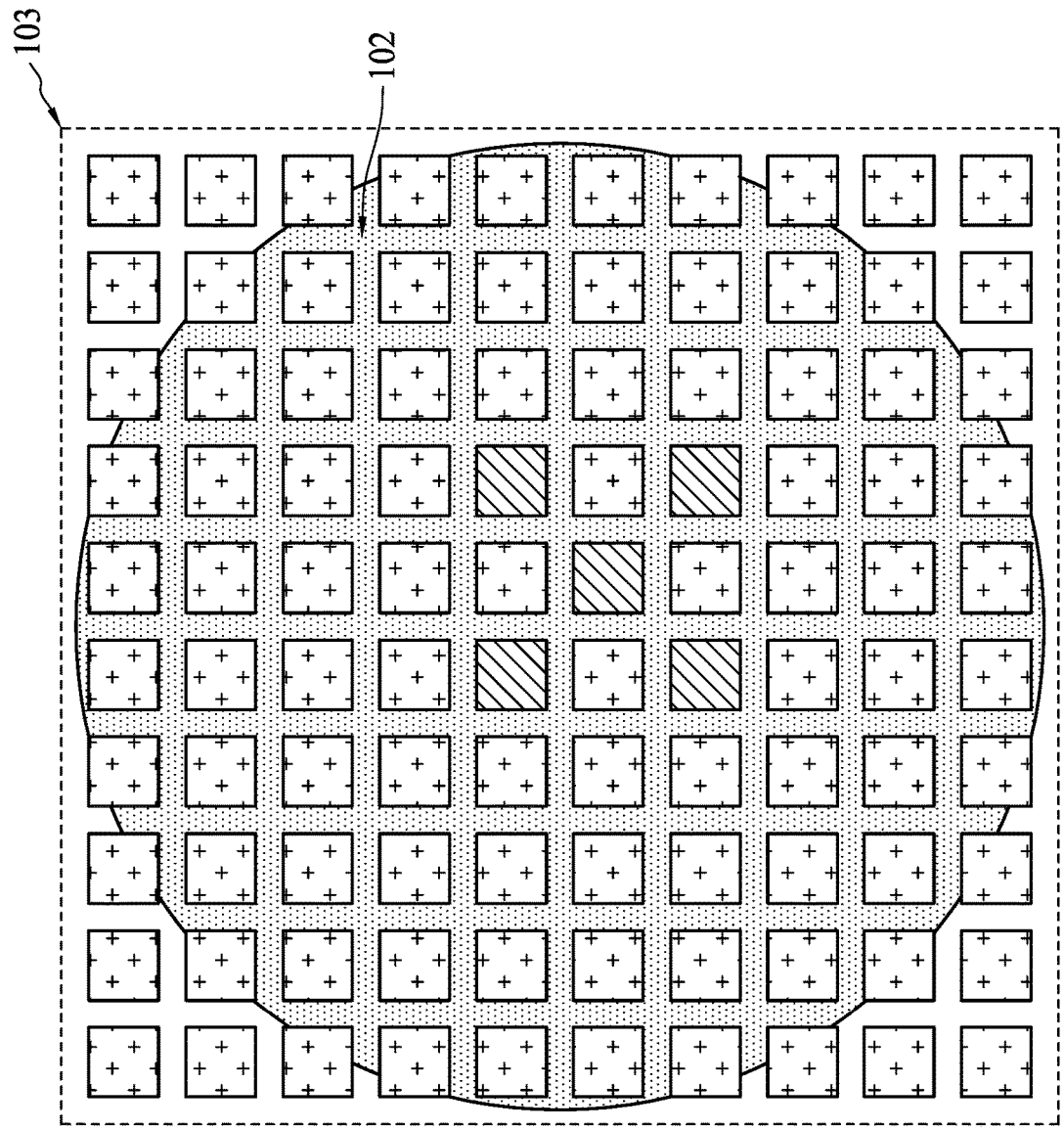
FIG. 14 is a top view showing a mix of a first and a second polarity patterns across a wafer, in accordance with some embodiments of the present disclosure

Referring to FIG. 13 and FIG. 14, FIG. 13 and FIG. 14 are top views showing a mix of a first and a second polarity patterns across a substrate or wafer 102, in accordance with some embodiments of the present disclosure. The light square represents the electromagnet having a first polarity pattern and the dark square a second polarity pattern. FIG. 13 shows the same polarity configuration as that in FIG. 10 and FIG. 11. Alternatively, the second polarity pattern could be programmed to be at a center of the counterface 100, according to the illustration of FIG. 14. It could be appreciated that an area of the first electromagnet array 103 shall be greater than an area of the substrate or wafer to be polished by completely covering a projection area of the substrate or the wafer 102.

It shall be appreciated that since the electromagnets can be individually programmed to be in either of the first or the second polarity pattern, the arrangement of the polarity pattern set at initial time of a polishing session can be different from the polarity pattern set at an intermediate of a final time of the polishing session, corresponding to the dynamic topography change of the substrate to be polished.

Figure 15:
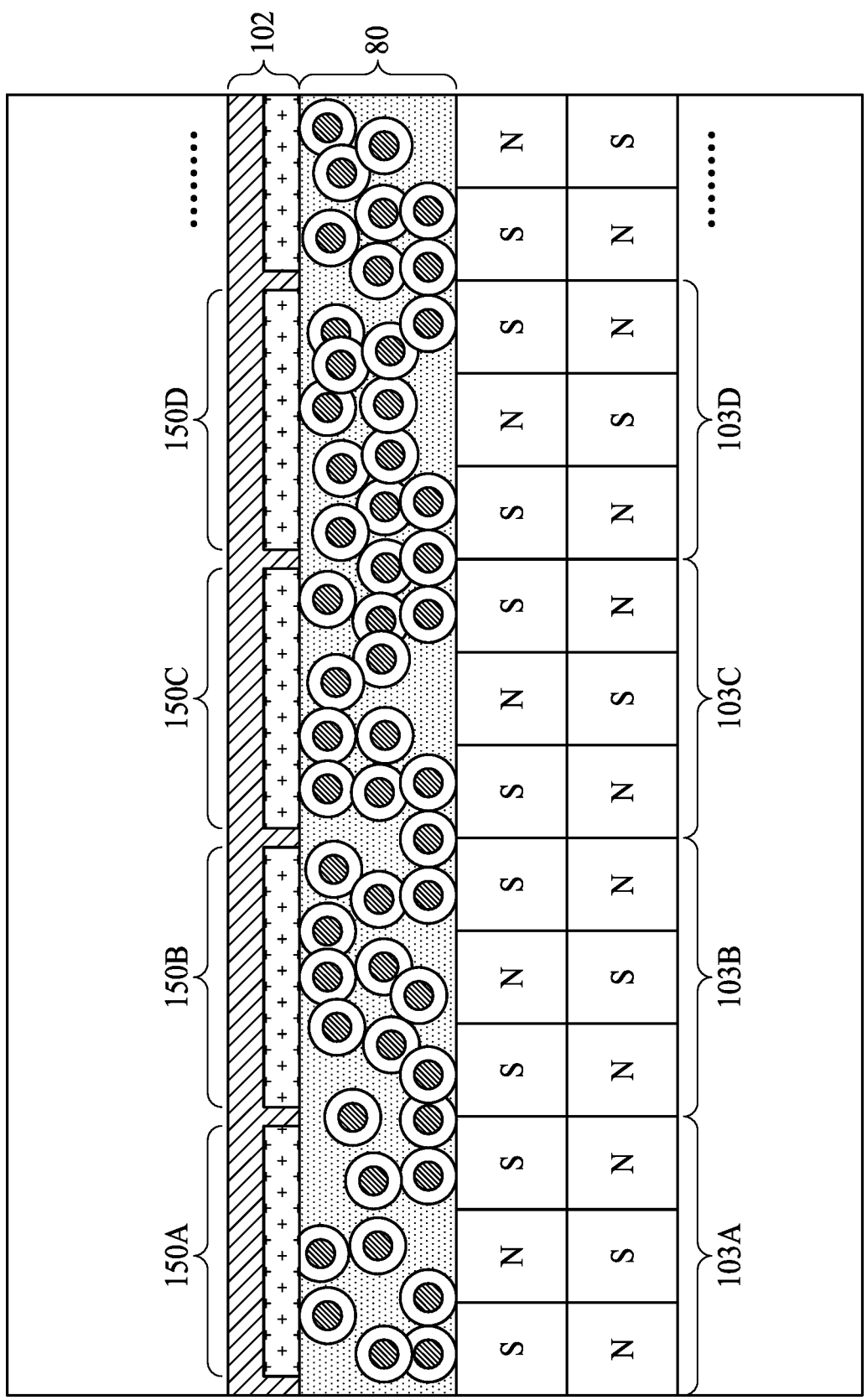
FIG. 15 is a top view showing a mix of a combination of the first polarity pattern and the second polarity pattern within several dies across a wafer, in accordance with some embodiments of the present disclosure.

Referring to FIG. 15, FIG. 15 is a top view showing a combination of the first and the second polarity patterns within several dies across a wafer, in accordance with some embodiments of the present disclosure. Compared to the embodiments discussed in FIG. 13 and FIG. 14, FIG. 15 shows a finer control of each of the electromagnets over an area of a die on the substrate 102. For example, the substrate 102 has several dies 150A, 150B, 150C, and 150D at a surface facing the CMP slurry 80. A first combination 103A of one second polarity pattern in the middle and two first polarity patterns at both sides is situated under the die 150A. Similarly, the second combination 103B under the die 150B, the third combination 103C under the die 150C, the fourth combination 103D under the die 150D. In some embodiments, each of combinations 103A-103D is having identical arrangement of the first polarity pattern and the second polarity pattern if the topography information of the dies 150A-150D are substantially identical. However, in some embodiments, each of combinations 103A-103D may have different arrangement of the first polarity pattern and the second polarity pattern according to different topography information of the dies 150A-150D.

Figure 16:
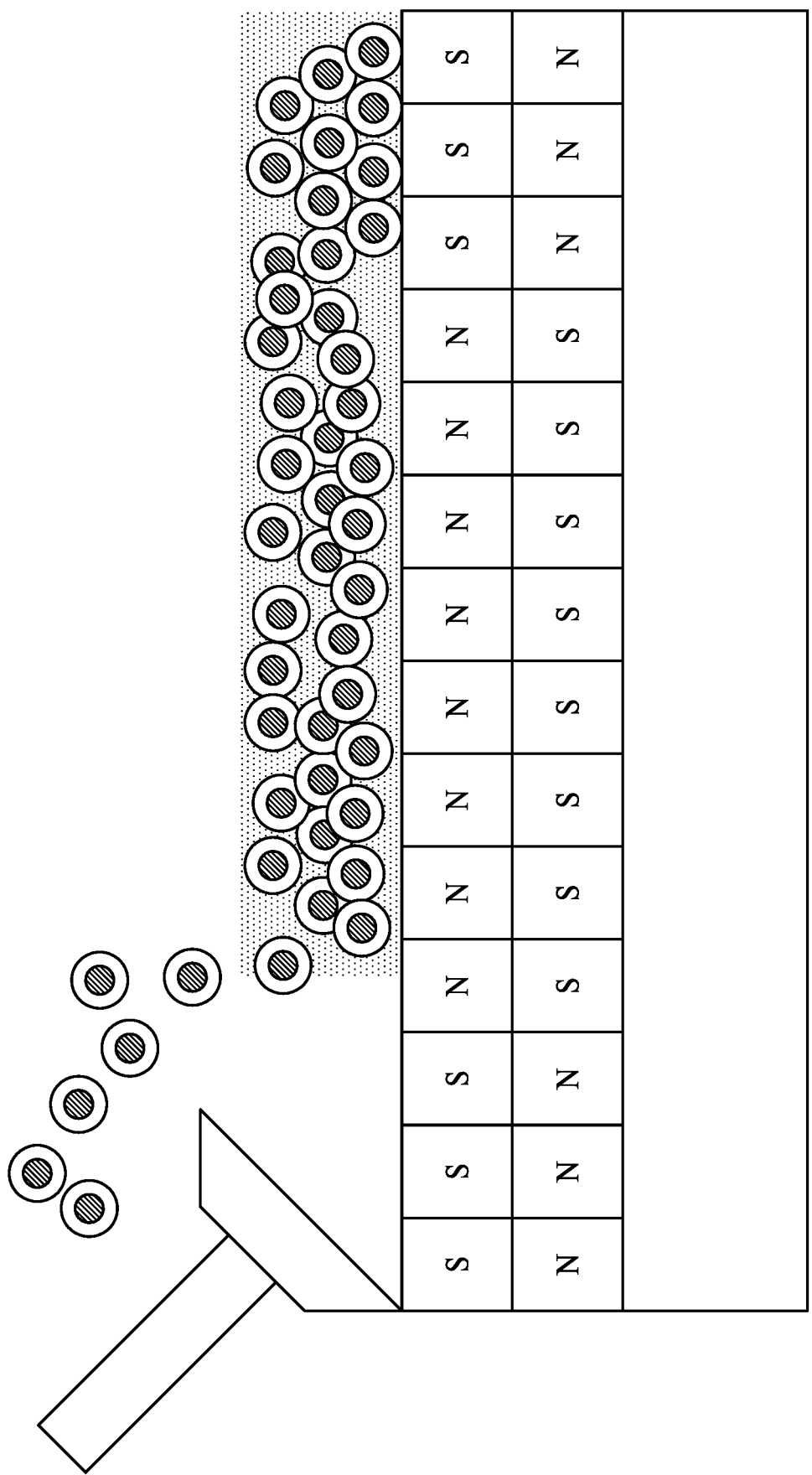
FIG. 16 is a cross sectional view showing a method for using a CMP apparatus with the slurry described herein, in accordance with some embodiments of the present disclosure.

Asperities from conventional polishing pads can become lost over time as the pad is exposed to viscoelastic flow. In order to refresh the polishing pad in response to these phenomena, brush type conditioners (e.g., polyvinyl alcohol based cross-linked brushes) or diamond conditioners are used in conventional systems. The design of the CMP slurry advantageously avoids the need for any such brush or diamond conditioning in accordance with some embodiments after the polishing pad has been in use. For example, instead of refreshing or replacing a conventional polishing pad, the CMP slurry can be simply removed from the first surface 101 after completing a polishing session, as shown in FIG. 16.

Some embodiments provide a CMP apparatus, including a counterface configured to support a semiconductor wafer at a first surface, a first electromagnet array under the first surface, a polishing head over the counterface and configured to hold the semiconductor wafer at a second surface, and a controller connects to the first electromagnet array. The first electromagnet array comprises a plurality of electromagnets, a polarity of each of the plurality of electromagnets is capable of being individually controlled by the controller.

Some embodiments provide a CMP slurry, including a magnetic polymer bead comprising a polymeric surface enclosing magnetic materials, an abrasive material, and an oxidizing agent. A diameter of the magnetic polymer bead is under 100 micrometer.

Some embodiments provide a method for using a chemical mechanical polishing apparatus, including providing a roughened counterface comprising a first electromagnet array, applying the slurry of claim 8 directly over the counterface, controlling each of a plurality of electromagnets of the first electromagnet array under the counterface by a controller to be in a first polarity pattern so as to arrange the magnetic polymer bead, and controlling a polarity of each of a plurality of electromagnets of the first electromagnet array under the counterface by the controller according to a topography information of the semiconductor wafer to be processed.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for using a chemical mechanical polishing apparatus, comprising:
   providing a roughened counterface comprising a first electromagnet array;
   applying a slurry directly on the roughened counterface;
   controlling a polarity of each of a plurality of electromagnets of the first electromagnet array under the roughened counterface by a controller to be in a first polarity pattern; and
   subsequent to controlling the polarity of each of the plurality of electromagnets of the first electromagnet array to be in the first polarity pattern, controlling the polarity of each of the plurality of electromagnets of the first electromagnet array under the counterface by the controller according to a topography information of a semiconductor wafer to be processed, wherein a portion of the first electromagnet array corresponding to a center of the semiconductor wafer is controlled to be in the first polarity pattern, and a portion of the first electromagnet array corresponding to a peripheral of the semiconductor wafer is controlled to be in a second polarity pattern.

2. The method of claim 1, further comprising:
descending a polish head comprising a second electromagnet array onto the counterface; and
controlling a polarity of each of a plurality of electromagnets of the second electromagnet array by the controller according to the topography information of the semiconductor wafer to be processed.

3. The method of claim 2, wherein the descending the polish head comprises carrying a semiconductor wafer on the polish head.

4. The method of claim 2, wherein the polarity of each of the plurality of electromagnets of the first electromagnet array is controlled to correspond to the polarity of each of the plurality of electromagnets of the second electromagnet array.

5. The method of claim 1, wherein a portion of the first electromagnet array corresponding to a first die of the semiconductor wafer is controlled to have a combination of the first polarity pattern and a third polarity pattern substantially identical to a portion of the first electromagnet array corresponding to a second die of the semiconductor wafer.

6. The method of claim 1, wherein a polarity pattern of the first electromagnet array is changing during a polishing session.

7. The method of claim 1, wherein the slurry comprises magnetic polymer beads, and the first polarity pattern exerts an attraction force on the magnetic polymer beads toward the counterface.

8. The method of claim 6, further comprising:
cleaning the counterface after completing the polishing session.

9. A method for using a chemical mechanical polishing apparatus, comprising:
providing a roughened counterface comprising a first electromagnet array;
applying a slurry directly on the roughened counterface, the slurry comprising:
magnetic polymer beads, each comprising a polymeric surface enclosing magnetic materials, a diameter of the magnetic polymer bead is under 100 micrometer;
an abrasive material; and
an oxidizing agent, wherein the roughened counterface is configured to prevent rotational movement of the magnetic polymer beads; and
controlling a polarity of each of a plurality of electromagnets of the first electromagnet array under the counterface by a controller to be in a first polarity pattern; and
subsequent to controlling the polarity of each of the plurality of electromagnets of the first electromagnet array to be in the first polarity pattern, controlling the polarity of each of the plurality of electromagnets of the first electromagnet array under the counterface by the controller to include the first polarity pattern and a second polarity pattern different from the first polarity pattern.

10. The method of claim 9, wherein the magnetic materials is at a core of each of the magnetic polymer beads.

11. The method of claim 9, wherein the magnetic materials is dispersed in each of the magnetic polymer beads.

12. The method of claim 9, wherein the abrasive materials is attached to the polymeric surface.

13. A method for using a chemical mechanical polishing apparatus, comprising:
providing a polycarbonate counterface configured to support a semiconductor wafer;
applying a slurry directly on the polycarbonate counterface, the slurry comprising magnetic polymer beads, wherein the polycarbonate counterface is configured to prevent rotational movement of the magnetic polymer beads;
controlling a polarity of each of a plurality of electromagnets of a first electromagnet array under the polycarbonate counterface by a controller to be in a first polarity pattern; and
subsequent to controlling the polarity of each of the plurality of electromagnets of the first electromagnet array to be in the first polarity pattern, descending a polish head onto the polycarbonate counterface to hold the semiconductor wafer at a surface of the polish head, wherein the polish head comprises a second electromagnet array having a plurality of electromagnets over the surface; and
controlling the polarity of each of the plurality of electromagnets of the first electromagnet array and each of the plurality of electromagnets of the second electromagnet array to be a second polarity pattern.

14. The method of claim 13, further comprising:
controlling the polarity of each of a plurality of electromagnets of the first electromagnet array under the polycarbonate counterface by the controller according to a topography information of the semiconductor wafer to be processed.

15. The method of claim 13, wherein the controller connects to the second electromagnet array.

16. The method of claim 13, wherein each of the plurality of the electromagnets of the first electromagnet array is arranged projectively corresponding to each of the plurality of the electromagnets of the second electromagnet array.

17. The method of claim 13, wherein the first electromagnet array is arranged projectively corresponding to the second electromagnet array.

18. The method of claim 13, wherein an area of the first electromagnet array is greater than an area of the semiconductor wafer.

19. The method of claim 13, wherein the second polarity pattern is configured to make more magnetic polymer beads in contact with a peripheral than a center of the semiconductor wafer.

20. The method of claim 7, wherein the roughened counterface is configured to prevent rotational movement of the magnetic polymer beads.

* * * * *